(12) United States Patent
Tepolt et al.

(10) Patent No.: US 9,693,469 B2
(45) Date of Patent: Jun. 27, 2017

(54) ELECTRONIC MODULE SUBASSEMBLIES

(71) Applicant: The Charles Stark Draper Laboratory, Inc., Cambridge, MA (US)

(72) Inventors: Gary B. Tepolt, Pelham, NH (US); John Merullo, Cambridge, MA (US); Jeffrey C. Thompson, Charlestown, MA (US); Berj Nercessian, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 194 days.

(21) Appl. No.: 14/134,661

(22) Filed: Dec. 19, 2013

(65) Prior Publication Data

US 2015/0181709 A1  Jun. 25, 2015

(51) Int. Cl.
| | | |
|---|---|---|
| *H05K 7/00* | (2006.01) | |
| *H05K 3/46* | (2006.01) | |
| *H05K 1/02* | (2006.01) | |
| *H05K 3/28* | (2006.01) | |
| *H05K 1/18* | (2006.01) | |
| *H05K 3/40* | (2006.01) | |

(52) U.S. Cl.
CPC .......... *H05K 3/4697* (2013.01); *H05K 1/0271* (2013.01); *H05K 1/183* (2013.01); *H05K 3/284* (2013.01); *H05K 3/4046* (2013.01); *H05K 3/4694* (2013.01); *H05K 2201/068* (2013.01); *H05K 2203/1572* (2013.01); *Y10T 156/1064* (2015.01)

(58) Field of Classification Search
CPC .......... H01L 2224/48091; H05K 1/141–1/144; H05K 1/14
USPC .................................. 361/782–795
See application file for complete search history.

(56) References Cited

U.S. PATENT DOCUMENTS

| | | | |
|---|---|---|---|
| 6,392,289 B1 * | 5/2002 | Tandy ..................... | H01L 22/20 257/431 |
| 6,492,195 B2 * | 12/2002 | Nakanishi ........... | H01L 21/6835 257/E21.569 |
| 7,312,621 B2 * | 12/2007 | Yamaguchi ........ | G01R 31/2886 324/756.07 |
| 7,727,806 B2 | 6/2010 | Uhland et al. | |
| 7,960,247 B2 | 6/2011 | Thompson et al. | |
| 8,017,451 B2 | 9/2011 | Racz et al. | |
| 8,273,603 B2 | 9/2012 | Racz et al. | |
| 8,535,984 B2 | 9/2013 | Racz et al. | |

(Continued)

*Primary Examiner* — Tuan T Dinh
(74) *Attorney, Agent, or Firm* — Nutter McClelland & Fish LLP

(57) ABSTRACT

An electronic module subassembly including a substrate. The substrate includes a bottom laminate, a middle laminate coupled to the bottom laminate, and a top laminate coupled to the middle laminate. The middle laminate has a plurality of web areas, each web area defining at least one hole. The defines a planar top surface and a plurality of open areas corresponding to and aligned with the plurality of web areas. First components have a first thickness. At least one first component is in each of the open areas. Second components have a second thickness relatively larger than the first thickness. At least one second component is in each of the open areas. The second components extend into the respective at least one hole of the web areas. Encapsulant fills in the open areas and the web areas.

5 Claims, 9 Drawing Sheets

(56) References Cited

U.S. PATENT DOCUMENTS

2012/0086135 A1  4/2012  Thompson et al.
2013/0093087 A1  4/2013  Chau et al.

* cited by examiner

ELECTRONIC MODULE SUBASSEMBLIES

BACKGROUND OF THE DISCLOSURE

1. Field of the Disclosure

The subject disclosure relates to fabricating multiple electronics modules that integrate thin silicon die (e.g., bare die of any size) with thick and/or tall components on a substrate that can be processed on standard lithographic processing equipment. The subject technology also includes the electronics modules resulting from the fabrication methods disclosed herein.

2. Background of the Related Art

Miniaturization of electronic components has continually become more and more dense. Such multi-component modules are commonly referred to as integrated ultra-high density (i-UHD). Advances in the i-UHD manufacturing and packaging process are critical to each step forward in the technology. Several examples of i-UHD technology are disclosed in U.S. Pat. Nos.: 7,727,806; 7,960,247; 8,017,451; and 8,273,603. U.S. PG Publication No. 2012/0086135 is also directed to i-UHD technology.

One type of i-UHD manufacturing process uses substrates with mirrored cavities fabricated from silicon wafers. Use of lithographic processing equipment for the fabrication has been widely used and well understood in the art. Despite the longstanding use, several disadvantages remain. The process is expensive and results in fragile structures. The resulting image plane tends to be bowed resulting in difficulty utilizing lithography equipment (e.g., controlling line width), thus yield is undesirably low. Substrates with mirrored cavities have also been fabricated of alumina or ceramic as an alternative. Though stiffer and tending to bow to a lesser degree, this approach also suffers from many disadvantages including those noted above for silicon wafers.

Substrates with through cavities can also be fabricated of alumina and silicon. However, very high stresses develop in the die cavities due to encapsulate shrinkage upon cure. After cure, Coefficient of Thermal Expansion (CTE) mismatch between silicon die and encapsulant again results in bow or distortion or cracking of the material within the cavity. Additional known problems are the substrate bow that occurs during manufacturing and module bow after singulation.

SUMMARY OF THE INVENTION

There is a need for improved electronic module fabrication techniques which creates flat components for additional processing. The subject technology eliminates fabrication problems relating to substrate bow during manufacturing and module bow after singulation.

The subject technology includes a substrate that has bilateral symmetry. The bilateral symmetry of the multi-chip and/or component modules makes the compressive and tensile stresses above and below the cavity web the same. This balanced core, or a cross-section that is symmetrical about the centerline of the PC Board's thickness, will remain flatter and not be subject to the bow of other methods and structures. In other words, for multi-chip module fabrication, a substrate with cavities mirrored on both sides of a web with the bare die arranged in the cavities and encapsulated with be free from stresses, compressive and tensile, that result from encapsulation shrinkage and CTE mismatch of materials because of the bilateral symmetry about the centerline of the cavity web.

In one embodiment, the present disclosure is directed to an electronic module subassembly including a substrate. The substrate includes a bottom laminate, a middle laminate coupled to the bottom laminate, and a top laminate coupled to the middle laminate. The middle laminate has a plurality of web areas, each web area defining at least one hole. The defines a planar top surface and a plurality of open areas corresponding to and aligned with the plurality of web areas. A plurality of first components have a first thickness. At least one first component is in each of the open areas. A plurality of second components have a second thickness relatively larger than the first thickness. At least one second component is also in each of the open areas. Such second components extend into the respective at least one hole of the web areas. Preferably, the first and second components include planar top surfaces aligned with the planar top surface of the top laminate so that further processing may easily be performed. Encapsulant fills in the open areas and the web areas, thereby covering at least a portion of the first and second components. Preferably, the encapuslant has an approximately matching coefficient of thermal expansion (CTE) to a CTE of the laminates of the substrate.

Each web area is a portion of a singular electronic module after being diced from the substrate. In one embodiment, the second components are a plurality free-end wire-bonds mounted in a block of encapsulant for forming connections between a top portion and a bottom portion of a multi-chip module. Traces and vias are made in the web areas for electrical interconnection as needed. The traces and vias may be made from copper and other like materials. Preferably, the bottom laminate has a plurality of web areas mirroring the web areas of the top laminate to result in bilateral symmetry about a centerline through the middle laminate.

The subject technology is also directed to a method for creating an electronic module subassembly. The method includes the steps of forming a plurality of web areas in a first laminate, wherein each web area defines at least one hole, forming a plurality of open areas in a second laminate, coupling the first and second laminates together so that the plurality of open areas are aligned with the plurality of web areas, encapsulating at least one first component in each of the open areas, wherein each first component has a first thickness, and encapsulating at least one second component in each of the open areas, wherein each second component extends into the respective at least one hole of the web areas, wherein each second component has a second thickness relatively larger than the first thickness. The encapsulating steps may be performed simultaneously.

The encapsulating is preferably done with an encapuslant that has an approximately matching coefficient of thermal expansion (CTE) to a CTE of the laminates. The method may also include coupling a bottom laminate to the first laminate and forming a plurality of open areas in the bottom laminate that mirror the plurality of open areas in the second laminate. The method also aligns the first and second components in a planar top surface of the second laminate. In one embodiment of the method, each web area defines a second hole, and further comprising the steps of: repeatedly encapsulating a plurality of free-end wire-bonds in a block of encapsulant to form a plurality of third components; and mounting at least one third component in the second hole and open area, wherein each third component has a third thickness relatively larger than the first thickness. Traces and vias in the web areas are formed to make electrical interconnections as needed.

The subject technology also includes an electronic module subassembly including a substrate having a first laminate having a plurality of web areas, each web area defining at least one hole, and a second laminate coupled to the first laminate. The second laminate defines a planar top surface and a plurality of open areas corresponding to and aligned with the plurality of web areas. A plurality of first components are provided with at least one first component in each of the open areas. Each first component has a first thickness. A plurality of second components are provided with at least one second component in each of the open areas and extending into the respective at least one hole of the web areas. Each second component has a second thickness relatively larger than the first thickness. Encapsulant fills in the open areas and the web areas coupling the first and second components to the first and second laminates.

Preferably, the first and second components include planar top surfaces aligned with the planar top surface of the first laminate, the encapsulant covers at least a portion of the first and second components, and the encapuslant has an approximately matching coefficient of thermal expansion (CTE) to a CTE of the first and second laminates. A third laminate may also be coupled to the first laminate and opposing the second laminate. The third laminate has a plurality of web areas mirroring the web areas of the second laminate to result in bilateral symmetry about a centerline through the first laminate.

It should be appreciated that the present technology can be implemented and utilized in numerous ways, including without limitation as a process, an apparatus, a system, a device, a method for applications now known and later developed. These and other unique features of the technology disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
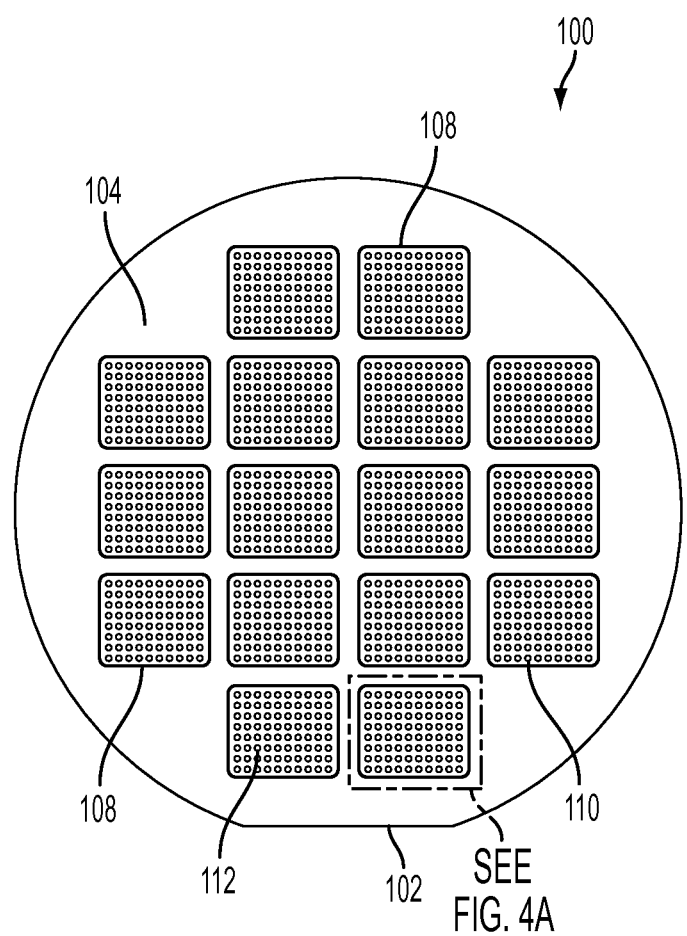
FIG. 1 is a top view of an assembled laminated substrate in accordance with the subject technology.

The present disclosure overcomes many of the prior art problems associated with fabrication of electronic modules, particularly i-UHD modules, with components of various thicknesses. The advantages, and other features of the system disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

All relative descriptions herein such as top, bottom, front, back, left, right, up, and down are with reference to the Figures, and not meant in a limiting sense. The illustrated embodiments can be understood as providing exemplary features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also exemplary and can be altered without materially affecting or limiting the disclosed technology.

Now referring to FIG. 1, a top view of an assembled laminated substrate 100 in accordance with the subject technology is shown. The substrate 100 is used to fabricate multiple electronics modules that integrate thin bare silicon die of any size with thick or tall components such as sensors of multiple types. The subject technology is particularly useful for i-UHD module fabrication. The substrate 100 can be processed on standard lithographic processing equipment or standard printed circuit fabrication equipment. The substrate 100 is shown as disk shaped with a flat 102, which is common for use with lithographic processing equipment. The substrate 100 may also be square or rectangular as is common with standard printed circuit fabrication equipment. Preferably, the substrate 100 is fabricated from glass epoxy and may be routed, cut, stamped or otherwise formed into the desired shape. The substrate 100 may also be fabricated of printed circuit board material. In any case, the substrate 100 may have a plurality of layers of dielectric with patterned copper interconnects as would be understood by one of ordinary skill in the art based upon review of the subject disclosure.

The substrate 100 has a top surface 104 and a bottom surface 106 (shown in FIG. 4B) with a plurality of mirrored cavities or depressions 108. A dividing central web 110 extends between each pair of aligned mirrored cavities 108. Each web 110 has an array of small holes 112 extending between the cavities 108. The substrate 100 and/or the web 110 may also have or be layers of dielectric with patterned copper interconnect.

Figure 2:
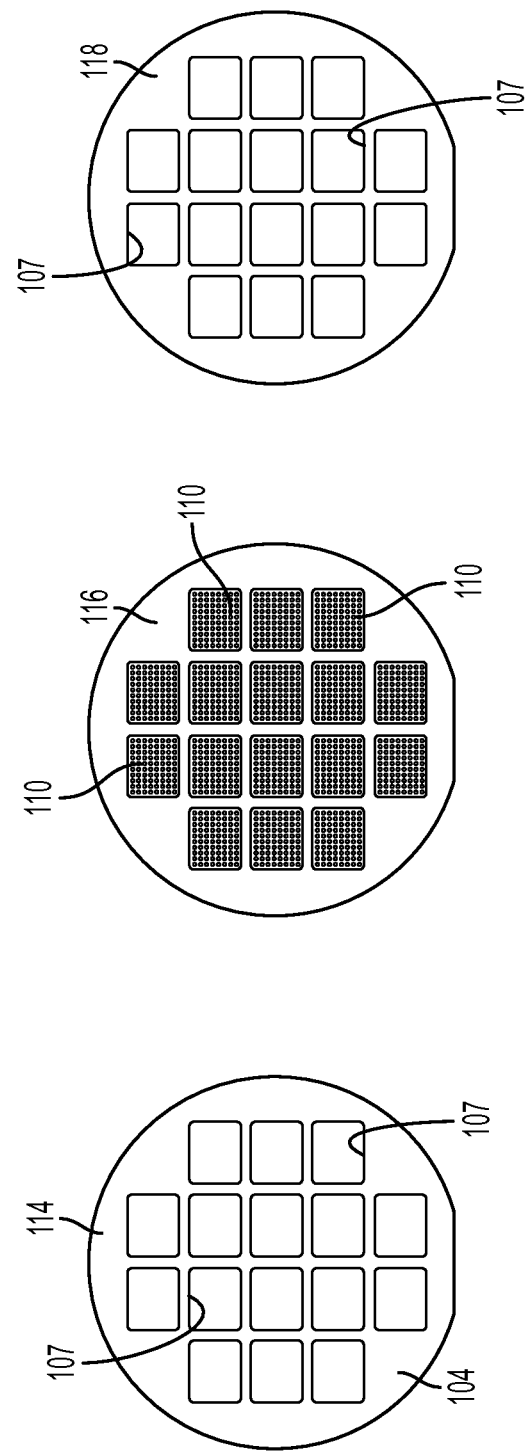
FIG. 2 is a top view of three laminates used to fabricate the substrate of FIG. 1 in accordance with the subject technology.

Referring now to FIG. 2, a top view of three separate laminates 114, 116, 118 used to fabricate the substrate 100 of FIG. 1 is shown. The top laminate 114 and the bottom laminate 118 are typically identical. The top and bottom laminates 114, 118 have a plurality of openings 107 that form the plurality of cavities 108. The openings 107 are arranged in a pattern to maximize the yield and may be of any size and shape. The middle laminate 116 forms the plurality of webs 110, which are preferably a matching size and shape of the openings 107. Any of the laminates 114, 116, 118 may be fabricated from a single, monolithic structure or itself be fabricated from multiple layers laminated together.

Figure 3:
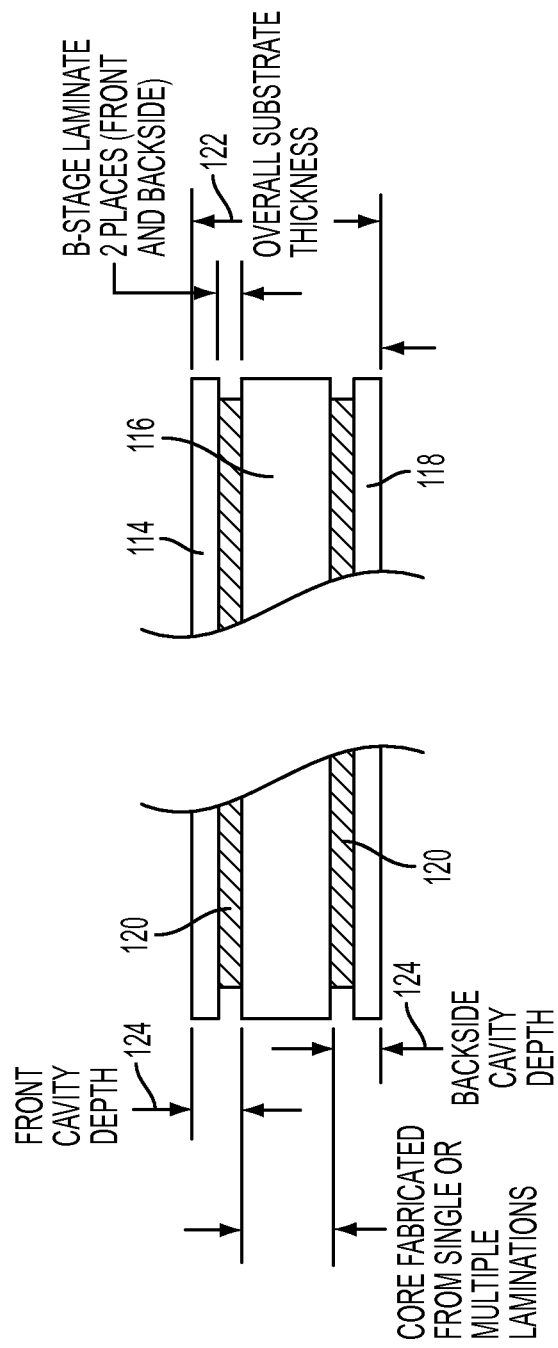
FIG. 3 is a side view of the substrate of FIG. 1 during fabrication in accordance with the subject technology.

FIG. 3 is a side view of the substrate 100 during fabrication. The substrate 100 is shown with break lines that indicate longer length than may be shown in FIG. 3. The laminates 114, 116, 118 are combined together by layers 120 of B-stage epoxy. Once cured and fully laminated, the substrate 100 will have an overall thickness 122, wherein the cavities 108 will have a depth 124 approximately equal to the combined thicknesses of the layers 120 and respective top or bottom laminate 114, 118.

Figure 4A:
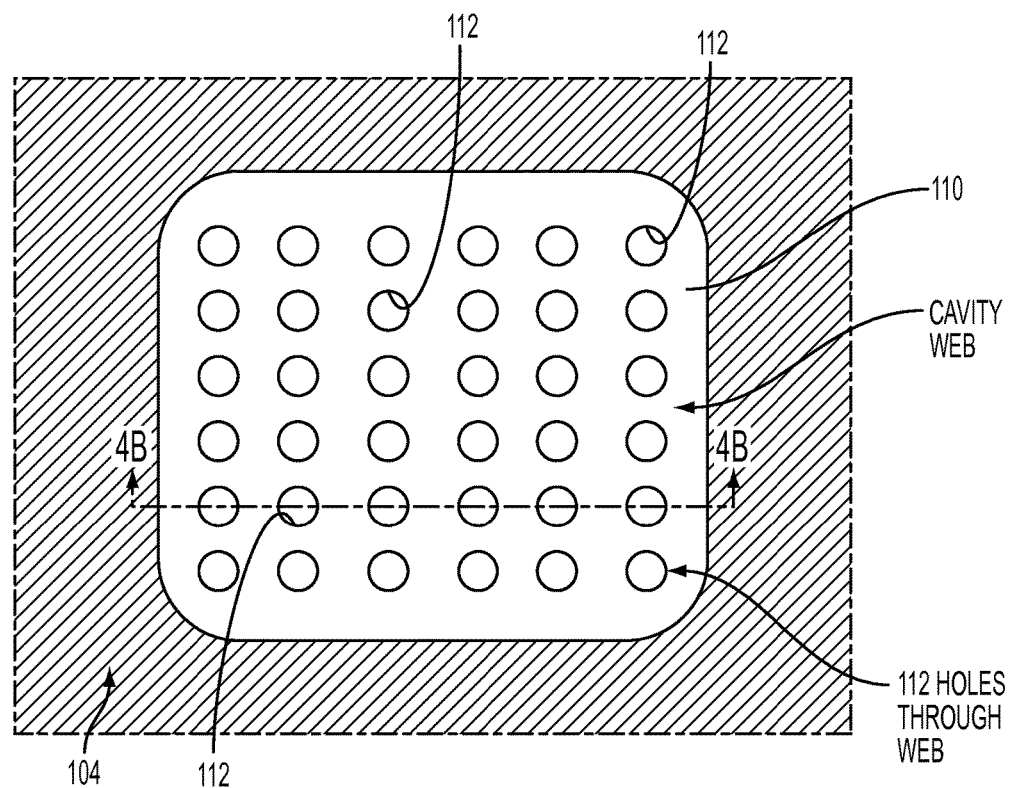
FIG. 4A is a top detailed view of a cavity within circle 4A of FIG. 1.

Referring now to FIG. 4A, a top detailed view of circle 4A of FIG. 1 is shown illustrating a cavity 108 in the substrate 100 after curing. As can be seen, each cavity 108 of the top laminate 114 aligns with a web 110 of the middle laminate 116, which aligns with the cavities 108 of the bottom laminate 118 so that passages are formed through the cavities 108 and holes 112. The web 110 has thirty-six holes 112 in a six by six array but any size, shape, number and arrangement of holes is possible.

Figure 4B:
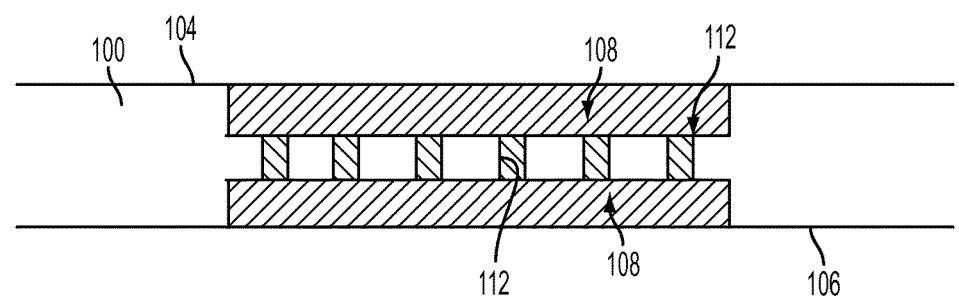
FIG. 4B is a cross-sectional view of the substrate taken along line 4B-4B of FIG. 4A.

FIG. 4B is a cross-sectional view of the substrate 100 taken along line 4B-4B of FIG. 4A prior to placement of any components. The top and bottom cavities 108 are each deep and wide enough to retain components of varying size and configurations. The depth and width of the cavities 108 along with the size and location of the holes 112 can be varied to accommodate particular configurations. For example, four thin dies (not shown) may be mounted in each cavity 108. The dies may be interconnected or connected to other components by traces (not shown) applied in traditional manners. The traces may extend from the top cavity 108 through one or more holes 112 into the bottom cavity 108. Traces may also connect across the substrate 100 from hole 112 to hole 112 and/or to other more traditional wires.

Figure 5A:
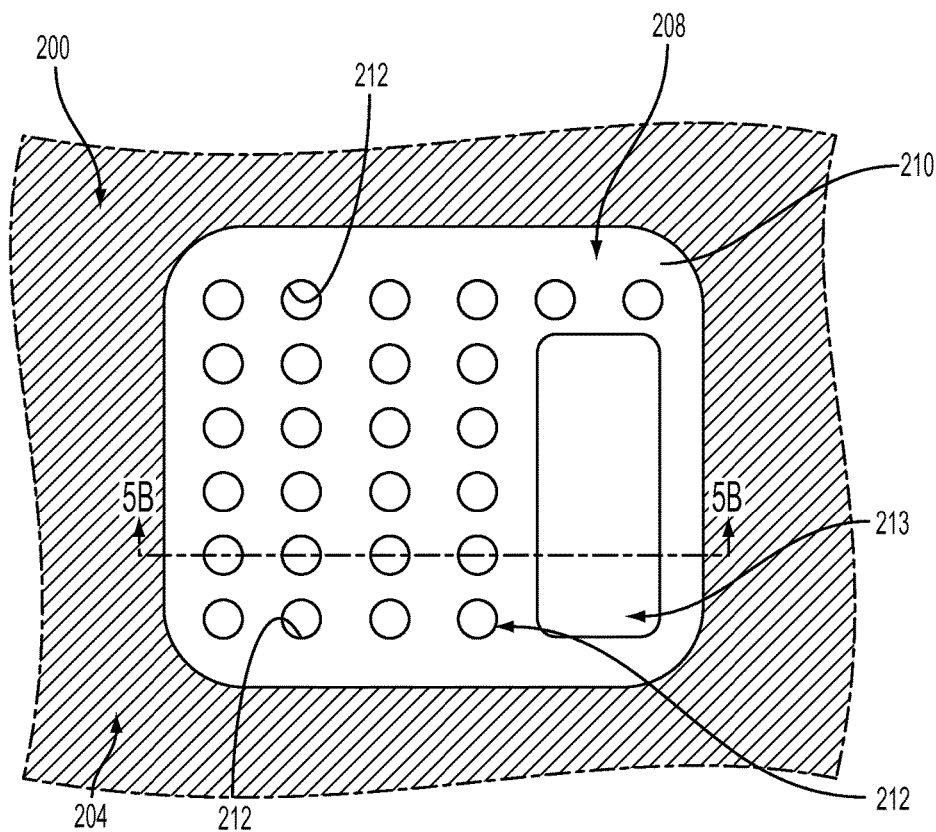
FIG. 5A is a top detailed view of a cavity in a substrate in accordance with the subject technology.
Figure 5B:
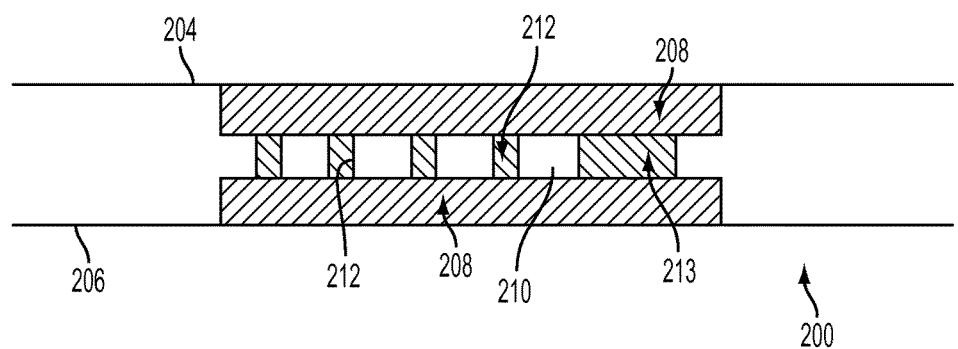
FIG. 5B is a cross-sectional view of the substrate taken along line 5B-5B of FIG. 5A.

FIGS. 5A and 5B are a top detailed view and a cross-sectional view of a cavity 208 in another substrate 200 in accordance with the subject technology. As will be appreciated by those of ordinary skill in the pertinent art, the substrate 200 utilizes similar principles to the substrate 100 described above. Accordingly, like reference numerals preceded by the numeral "2" instead of the numeral "1", are used to indicate like elements.

The primary difference of the substrate 200 in comparison to the substrate 100 is the formation of a large hole 213 in each of the webs 210. The large hole 213 creates ample space for a tall component 228 (shown in FIGS. 6A and 6B). The tall component 228 may be a sensor, capacitor, or any other desired component. The large hole 213 may be formed concurrently with the smaller holes 212 or machined at a different time.

Figure 6A:
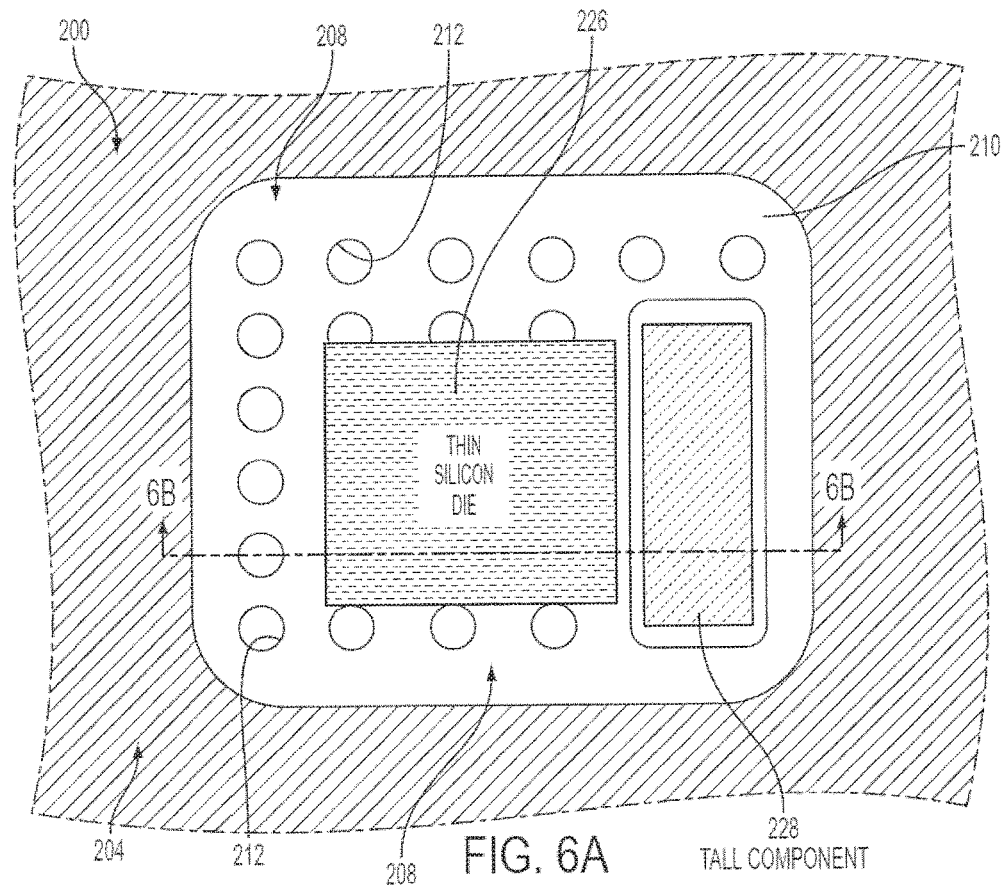
FIG. 6A is a top detailed view of the cavity in the substrate of FIG. 5A with components.
Figure 6B:
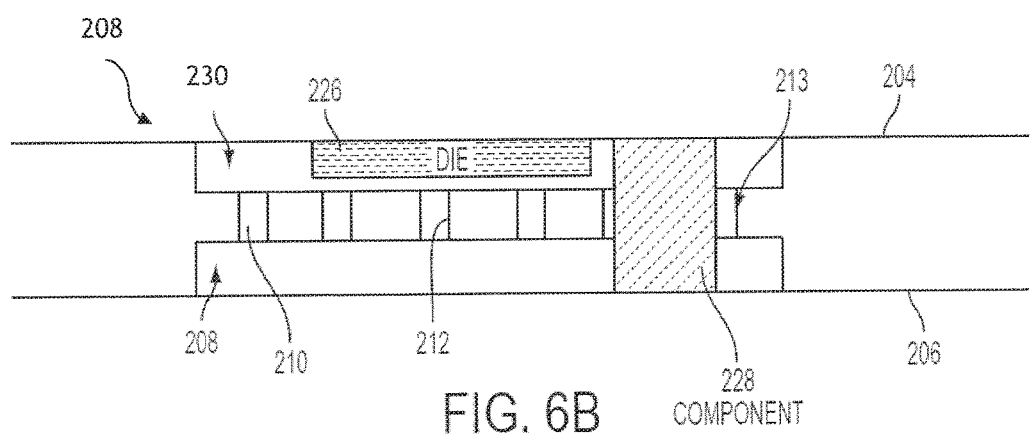
FIG. 6B is a cross-sectional view of the substrate taken along line 6B-6B of FIG. 6A.
Figure 7A:
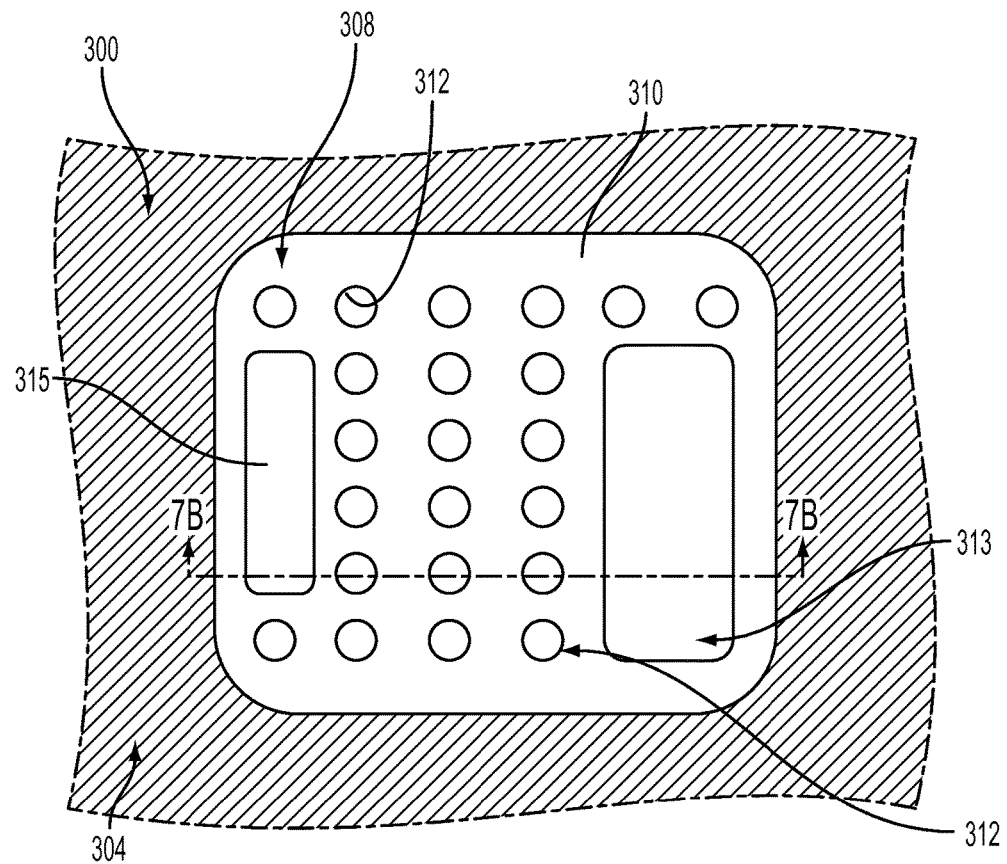
FIG. 7A is a top detailed view of a cavity in a substrate in accordance with the subject technology.
Figure 7B:
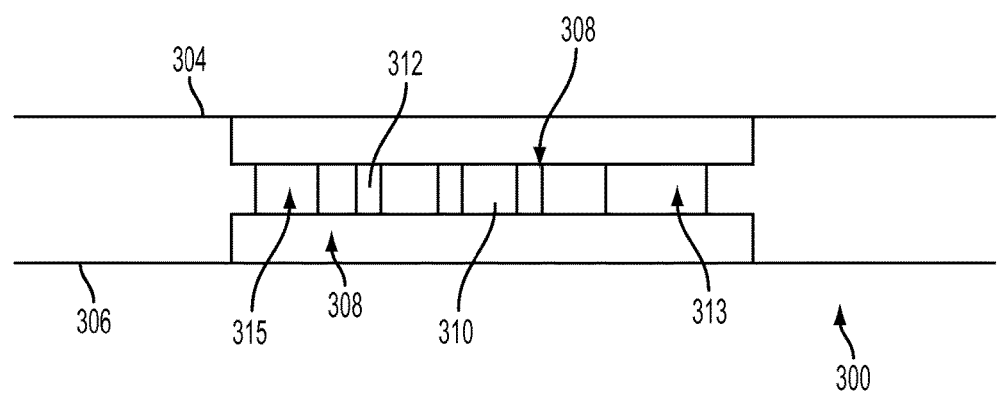
FIG. 7B is a cross-sectional view of the substrate taken along line 7B-7B of FIG. 7A.
Figure 8A:
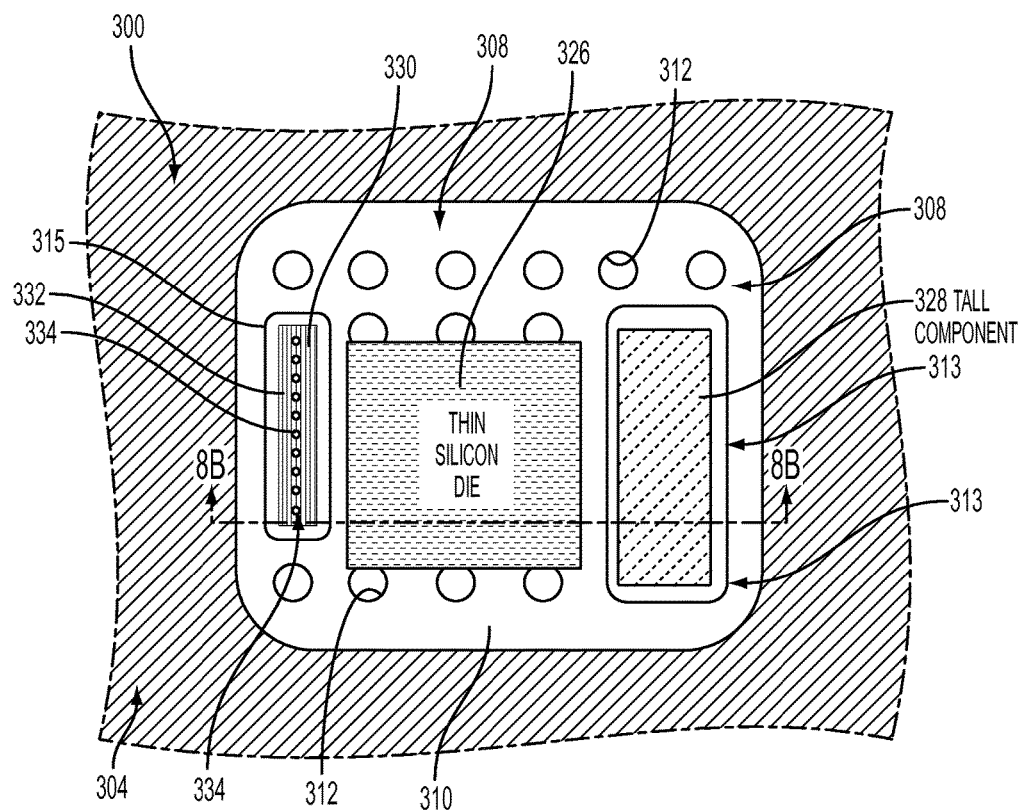
FIG. 8A is a top detailed view of the cavity in the substrate of FIG. 7A with components.
Figure 8B:
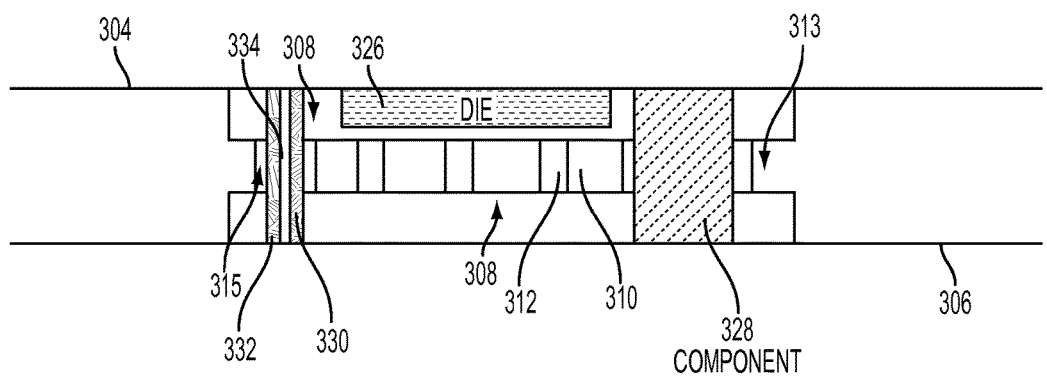
FIG. 8B is a cross-sectional view of the substrate taken along line 8B-8B of FIG. 6A.

Referring now to FIGS. 6A and 6B, a top detailed view and a cross-sectional view of the mirrored cavity 208 in the substrate 200 of FIG. 5A is shown with a thin silicon die 226 and the tall component 228 in place for fabrication. In order to locate the silicon die 226 in the cavity 208 and the tall component 228 in the large hole 213, the silicon dies 226 and tall components 228 are picked and placed on sticky film (not shown) in predetermined locations to align with the cavities 208 and large holes 213. Once the sticky film has been adhered to the substrate 200 to position the dies 226 and components 228 as shown, the substrate 200 can be molded. As can be seen best in FIG. 6B, the die 226 and the tall component 228 are significantly different in thickness yet the result is that both are fit in such a way as to be co-planar in the top surface 204.

To mold the substrate 200, vacuum is applied while an encapsulant paste 230 is pressed into the open space of the cavities 208, holes 212, and large holes 213. Once the encapsulant 230 is cured, the sticky film can be removed resulting in a flat, clean planar top surface 204 in which the silicon dies 226 and tall components 228 are exposed.

Because the glass epoxy of the substrate 200 and encapsulant has similar or the same CTE, the typical stresses and bowing of the prior art is avoided. As a result the planar top surface 204, the substrate 200 can be further processed using standard lithographic equipment. Subsequent processing may include applying: multiple layers of dielectric; copper for interconnections; solder balls by ball grid array technology; and/or any other desired processing now known and later developed as well as singulation.

Referring to FIGS. 7A-8B, several views of another cavity 308 in another substrate 300 are shown. As will be appreciated by those of ordinary skill in the pertinent art, the substrate 300 utilizes similar principles to the substrates 100, 200 described above and like reference numerals are used for like features. The primary difference of the substrate 300 in comparison to the substrate 200 is the formation of a second large hole 315 in each of the webs 310. The second large hole 315 creates ample space for a second tall component 330. The second tall component 330 is a tall post connection assembly for providing top to bottom electrical connections. The tall post connection assembly 330 is a block of molding compound 332 holding a plurality of electrically conducting posts 334. The tall post connection assembly 330 may be pre-assembled using free-end wire bonds as the conducting posts 334.

For assembly, the tall post connection assemblies 330 are again particularly applied to a sticky film with the dies 326 and other components 328. Once applied to the substrate 300, the tall post connection assemblies 315, the dies 326 and other components 328 are molded in place as shown, coplanar with the top and bottom surfaces 304, 306. The molding compound may be the same or different from the encapsulant. In any case, the posts 334 provide electrical connections between the top surface 304 and the bottom surface 306. The posts 334 may interconnect circuits laid down on the surfaces 304, 306 and/or additional traces and/or vias.

Figure 9A:
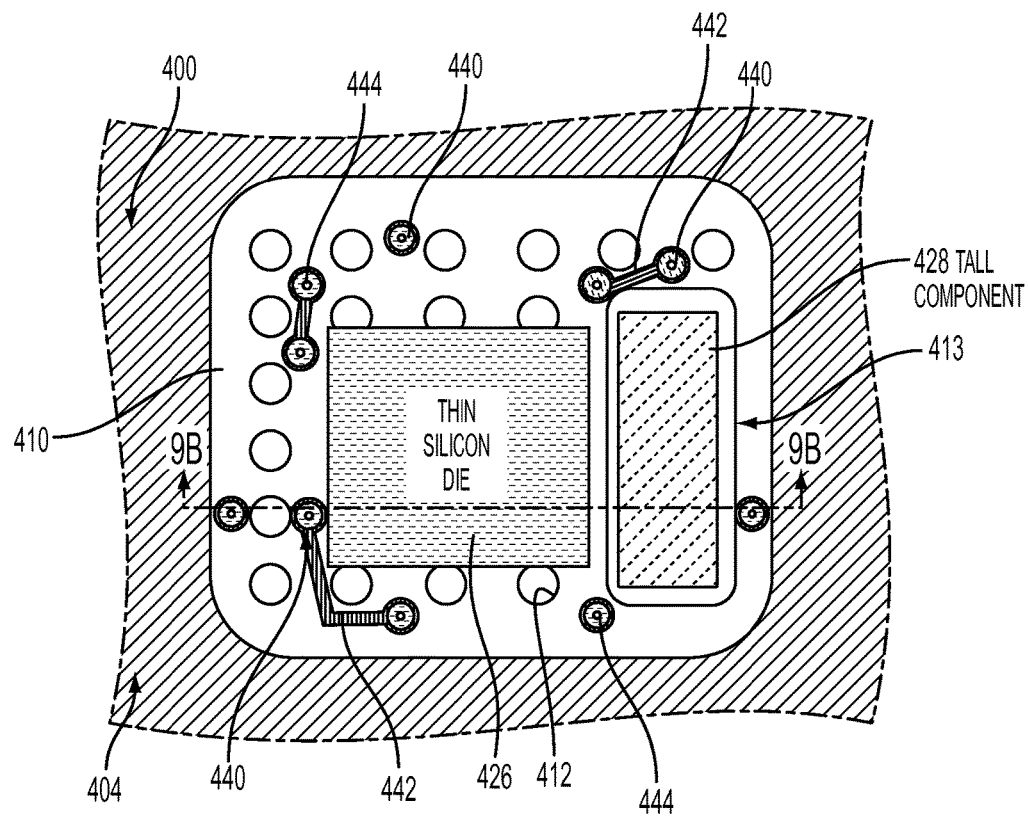
FIG. 9A is a top detailed view of still another cavity in a substrate in accordance with the subject technology.

FIG. 9A is a top detailed view of still another mirrored cavity 408 in a substrate 400 in accordance with the subject technology. Again, the substrate 400 utilizes similar principles to the substrates 100, 200, 300 described above and like reference numerals are used for like features. The primary difference of the substrate 400 in comparison to the substrates 100, 200, 300 is the inclusion of vias 440 and traces 442. The vias 440 are built into the webs 410 using typical lithographic or printed circuit board technology. The traces 442 are also applied using typical printed circuit board technology. The vias 440 and traces 442 are laid down adjacent but not on the holes 412 of the web 410. The vias 440 pass through the web 410 to electrically connect components in opposing cavities. As shown, each via 440 connects to a free end wire bond 444, which, in turn, further connects to another component (not shown). The traces and vias 440 allow the free-end wire bonds to be placed anywhere within the cavity 408.

Figure 9B:
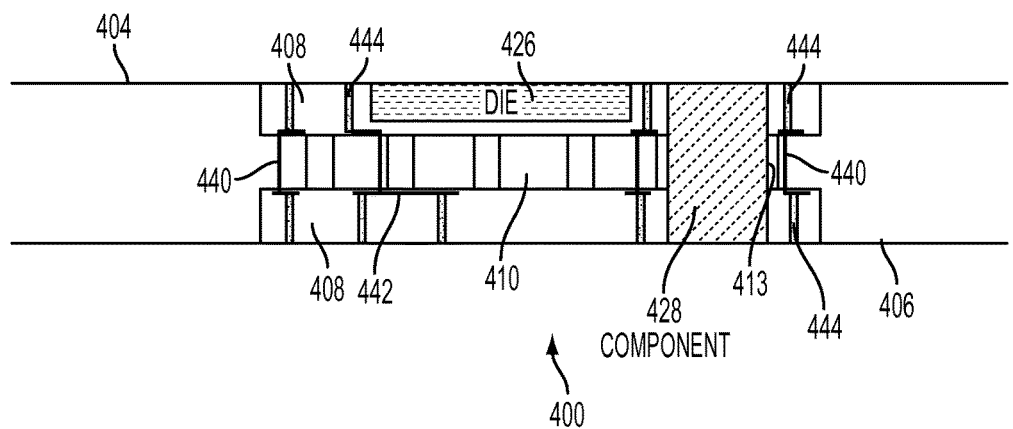
FIG. 9B is a cross-sectional view of the substrate taken along line 9B-9B of FIG. 9A.

Referring now to FIG. 9B, a cross-sectional view of the cavity 408 taken along line 9B-9B of FIG. 9A is shown. To assemble the substrate 400, the top, bottom and middle laminates 414, 416, 418 are assembled, then the vias 440 and traces 442 are applied using, for example, printed circuit or microlithographic technologies. Next, the free end wire bonds 444 are applied, for example, using solder ball techniques like in U.S. PG Pub. No. 2013/0093087. The bare dies 426 and components 428 are particularly applied to a sticky film that is placed upon the substrate 400. Once the dies 426 and components 428 are in position on the substrate 400, the dies 426 and components 428 are molded in place as shown, coplanar with the top and bottom surfaces 404, 406.

As one of ordinary skill would understand, the completed substrates can be cut apart along the edges of the webs to yield modules for further processing or further processed as a unit. For example, completed substrates can have additional laminates applied and connected to the top and bottom surfaces or even multi-layer substrates can be joined to other substrates. The middle laminates (e.g., 116) and other laminate structures represented as monolithic can also be fabricated by joining a plurality of layers. Additionally, the substrate may be fabricated from just the top and middle layers. Although such would not include mirrored cavities, it would still provide the ability to effectively package components of varying height. In view of the above, complex structures of a theoretically limitless number of layers can be constructed.

It is also envisioned that the mirrored cavities of the substrate could accommodate any configuration of dies, components, free-end wire bonds and the like without regard to varying thickness yet still allow further processing. The planar top and bottom surfaces allow efficient well-known techniques to conduct the further processing. Once the assembly of the substrates is completed, the substrates are diced along the edges of the cavities to form singular modules ready for subsequent processing into electronic modules.

As can be seen, PC Board materials such as glass epoxy can be used to fabricate the substrates with mirrored cavities so that the CTE can be closely approximated or matched to the encapsulant. Thus, after encapsulant cure, the substrates and cavity walls will grow at the same rate as the encapsulant when exposed to high processing temperatures, limiting substrate and cavity stresses, resulting in much less deformation.

The PC Board materials are readily available in many standard thicknesses. Thus, the substrate thickness and cavity depth can be readily modified to accommodate die or sensors of different thicknesses. Further, PC Board fabrication costs are very competitive so that laminating thin sheets using PC board fabrication processes results in much lower costs than fabricating substrates with cavities from silicon, ceramic or other solid materials.

Further, traces of copper and like materials can be patterned into the substrate and cavity web laminations providing multiple layers of interconnect. Interconnect layers can also be patterned onto the exterior surfaces of substrates and cavity surfaces. Copper traces that are patterned into the front and back surfaces of the cavity web can be metalized to allow the formation of connections between the electrical interconnect built into the web and the front, or backsides of the finished Multi Chip Module. These conductive features or conductive posts can be fabricated using free-end wire-bonds. The conductive features could also be conductive pins pressed into holes or other similar techniques. Thus, the subject technology allows much taller conductive features to be formed and at a much lower cost than initial iUHD thru via posts (e.g., copper plated silicon posts), created when etching cavities into silicon wafers. Unlike the etched silicon post fabrication technique, the subject technology can rework a poorly formed post to reduce scrap material.

As would be appreciated by those of ordinary skill in the pertinent art, the subject technology is applicable to fabrication of electronic modules. The functions of several elements may, in alternative embodiments, be carried out by fewer elements, or a single element. Similarly, in some embodiments, any functional element may perform fewer, or different, operations than those described with respect to the illustrated embodiment. Also, functional elements shown as distinct for purposes of illustration may be incorporated within other functional elements, separated in different hardware or distributed in various ways in a particular implementation. Further, relative size and location are merely somewhat schematic and it is understood that not only the same but many other embodiments could have varying depictions.

INCORPORATION BY REFERENCE

All patents, published patent applications and other references disclosed herein are hereby expressly incorporated in their entireties by reference.

While the invention has been described with respect to preferred embodiments, those skilled in the art will readily appreciate that various changes and/or modifications can be made to the invention without departing from the spirit or scope of the invention. For example, each claim may depend from any or all claims, even in a multiple dependent manner, even though such has not been originally claimed.

What is claimed is:

1. An electronic module subassembly comprising:
    a) a substrate including:
        i) a bottom laminate having a plurality of open areas;
        ii) a top laminate defining a planar top surface and having a plurality of open areas; and
        iii) a middle laminate coupled to the top and bottom laminates, the middle laminate having a plurality of web areas, the web areas having a matching size and shape as the open areas of the top and bottom laminates;
    b) a plurality of first components, at least one first component in each of the open areas, wherein each first component has a first thickness;
    c) a plurality of second components, at least one second component in each of the open areas and extending into the respective at least one hole of the web areas, wherein each second component has a second thickness relatively larger than the first thickness, wherein the first and second components include planar top surfaces aligned with the planar top surface of the top laminate; and
    d) encapsulant filling in the open areas and the web areas and covering at least a portion of the first and second components, wherein the encapsulant has an approximately matching coefficient of thermal expansion (CTE) to a CTE of the laminates of the substrate.

2. An electronic module subassembly as recited in claim 1, wherein each web area is a portion of a singular electronic module after being diced from the substrate.

3. An electronic module subassembly as recited in claim 1, wherein the second components are a plurality of free-end wire-bonds mounted in a block of encapsulant for forming connections between a top portion and a bottom portion of a multi-chip module.

4. An electronic module subassembly as recited in claim 1, further comprising copper traces and vias in the web areas for electrical interconnection.

5. An electronic module subassembly as recited in claim 1, wherein the bottom laminate has a plurality of web areas mirroring the web areas of the top laminate to result in bilateral symmetry about a centerline through the middle laminate.

\* \* \* \* \*